(12) United States Patent
Murden, II et al.

(10) Patent No.: US 7,138,865 B1
(45) Date of Patent: Nov. 21, 2006

(54) DIFFERENTIAL AMPLIFIERS WITH ENHANCED GAIN AND CONTROLLED COMMON-MODE OUTPUT LEVEL

(75) Inventors: Franklin Marshall Murden, II, Greensboro, NC (US); Scott Gregory Bardsley, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/243,829

(22) Filed: Oct. 4, 2005

(51) Int. Cl.
*H03F 3/45* (2006.01)
(52) U.S. Cl. .................................. 330/252; 330/253
(58) Field of Classification Search .............. 341/135, 341/136, 155, 156, 172; 330/9, 252, 253, 330/161, 258
See application file for complete search history.

(56) References Cited

U.S. PATENT DOCUMENTS

| | | | |
|---|---|---|---|
| 5,525,930 A * | 6/1996 | Pothast et al. .............. | 330/252 |
| 5,530,444 A * | 6/1996 | Tice et al. ................... | 341/156 |
| 5,703,532 A * | 12/1997 | Shin et al. ................... | 330/253 |
| 5,933,056 A | 8/1999 | Rothenberg ................. | 330/258 |
| 5,963,084 A | 10/1999 | Eschauzier .................. | 327/553 |
| 6,172,636 B1 * | 1/2001 | Murden et al. ............. | 341/155 |
| 6,486,820 B1 | 11/2002 | Allworth et al. ............ | 341/161 |
| 6,556,081 B1 | 4/2003 | Muza .......................... | 330/253 |
| 6,577,184 B1 | 6/2003 | Kwan et al. .................... | 330/9 |
| 6,778,013 B1 * | 8/2004 | Ali ............................... | 330/252 |
| 6,825,724 B1 * | 11/2004 | Jaussi .......................... | 330/260 |
| 6,985,035 B1 * | 1/2006 | Khorramabadi ............. | 330/253 |

OTHER PUBLICATIONS

Razavi, Behzad, "Design of Analog CMOS Integrated Circuits", 2001, McGraw-Hill Corporation, New York, NY, pp. 314-324, no month.
Gray, Paul, et al., "Analysis and Design of Analog Ingegrated Circuits", 2001, John Wiley & Sons, fourth edition, pp. 824-832, no month.

* cited by examiner

*Primary Examiner*—Linh Nguyen
(74) *Attorney, Agent, or Firm*—Koppel, Patrick & Heybl

(57) ABSTRACT

Differential amplifiers are provided with a common-mode controller that establishes an amplifier common-mode output level while it also enhances amplifier gain and output impedance. The amplifier includes cascode transistors and the controller includes positive-feedback transistors that respond to an output side of the cascode transistors and negative-feedback transistors that respond to an input side of the cascode transistors. Gain and output impedance are increased by the positive-feedback transistors and the increase is controlled by the negative-feedback transistors. Common-mode level is established by voltages between current and control terminals of the positive-feedback transistors. The differential amplifiers are shown to be especially suited for use in switched-capacitor structures.

20 Claims, 6 Drawing Sheets

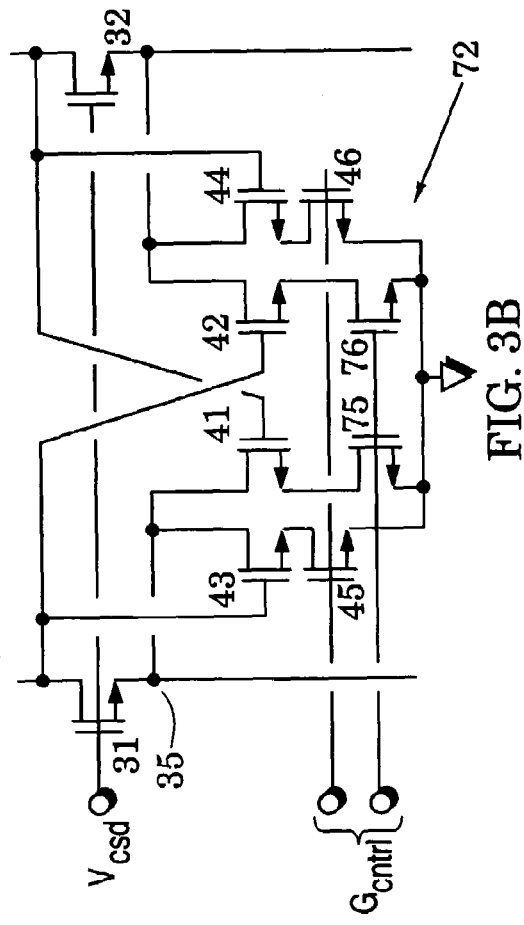
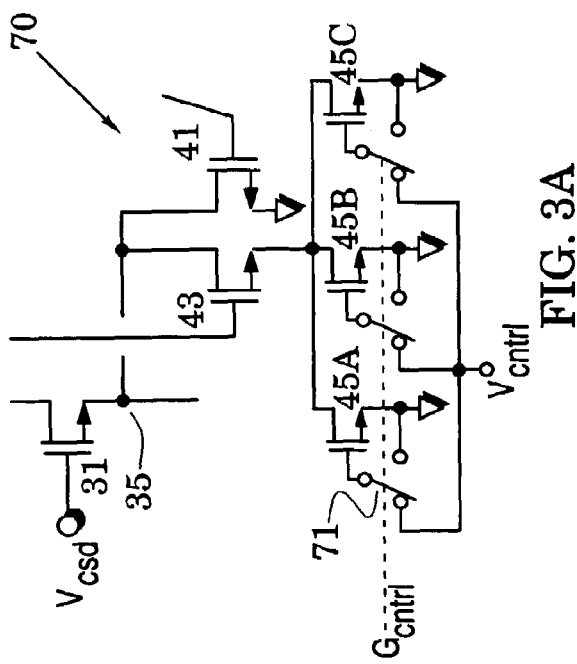
FIG. 3B
FIG. 3A

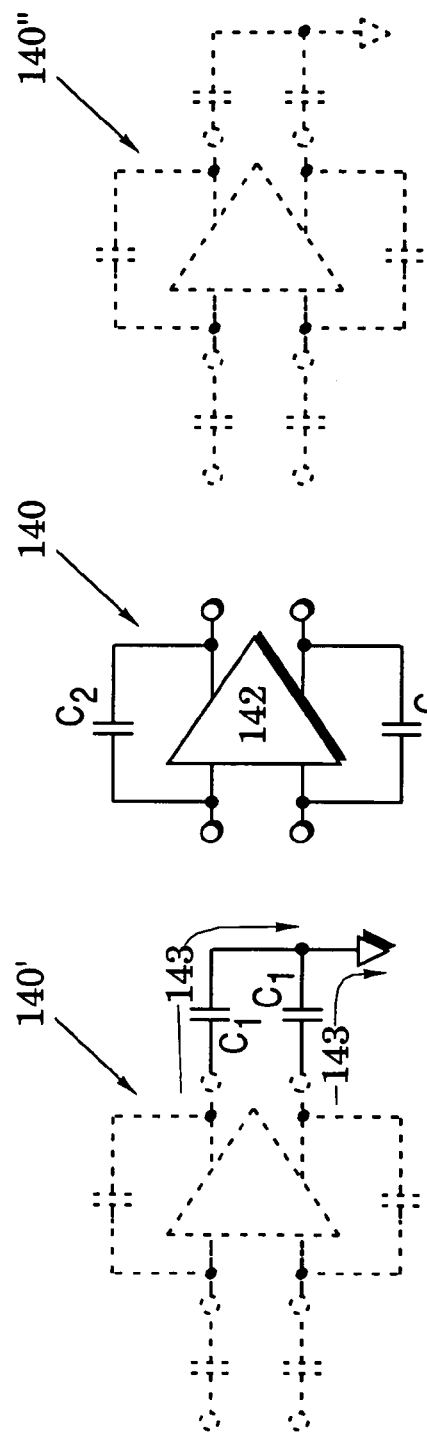
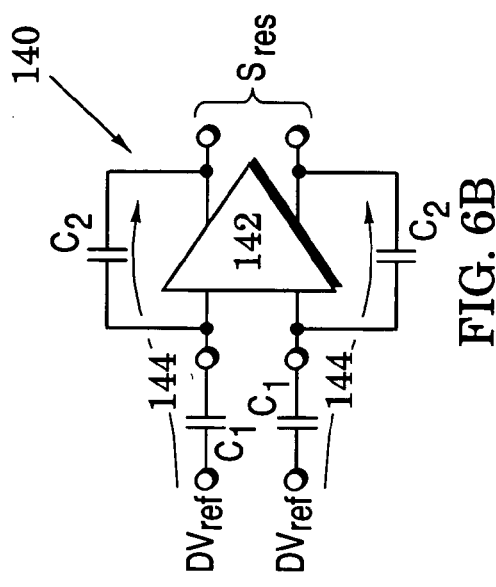
FIG. 6A
FIG. 6B

DIFFERENTIAL AMPLIFIERS WITH ENHANCED GAIN AND CONTROLLED COMMON-MODE OUTPUT LEVEL

BACKGROUND OF THE INVENTION

1. Field of the Invention

The present invention relates generally to differential amplifiers and, more particularly, to analog-to-digital converter systems that include such amplifiers.

2. Description of the Related Art

The usefulness of a variety of signal conditioning systems is dependent upon accurate signal processing. For example, pipelined analog-to-digital converter systems are typically formed with a plurality of converter stages that are serially connected to thereby convert an analog input signal to a corresponding digital output word. All but the last of these converter stages convert a respective portion of the input signal to at least one corresponding digital bit of the output word and pass a residue signal to a succeeding converter stage for determination of additional digital bits of the output word.

The residue signal is often generated with an amplifier and a set of capacitors that are switched in a first operational mode to receive an electrical charge from a preceding converter stage and switched in a second operational mode to transfer this charge to capacitors coupled between the amplifier's input and output. The accuracy of these charge-reception and charge-transfer processes has often been degraded by deficiencies in the amplifier's operational parameters (e.g., gain, input impedance, and common-mode output level).

BRIEF SUMMARY OF THE INVENTION

The present invention is directed to differential amplifiers that have enhanced gain and controlled common-mode output level. The novel features of the invention are set forth with particularity in the appended claims. The invention will be best understood from the following description when read in conjunction with the accompanying drawings.

BRIEF DESCRIPTION OF THE DRAWINGS

FIGS. 3A and 3B are schematics of other embodiments of control portions of the amplifier of FIG. 1;

FIGS. 6A and 6B are schematics that illustrate operational modes of multiplying digital-to-analog converters shown in FIG. 5.

DETAILED DESCRIPTION OF THE INVENTION

FIGS. 1–4 illustrate differential amplifier embodiments and a common-mode controller that establishes an amplifier common-mode output level while also increasing amplifier gain and amplifier output impedance. FIGS. 5–6B illustrate the use of these amplifiers in analog-to-digital converter systems.

Figure 1:
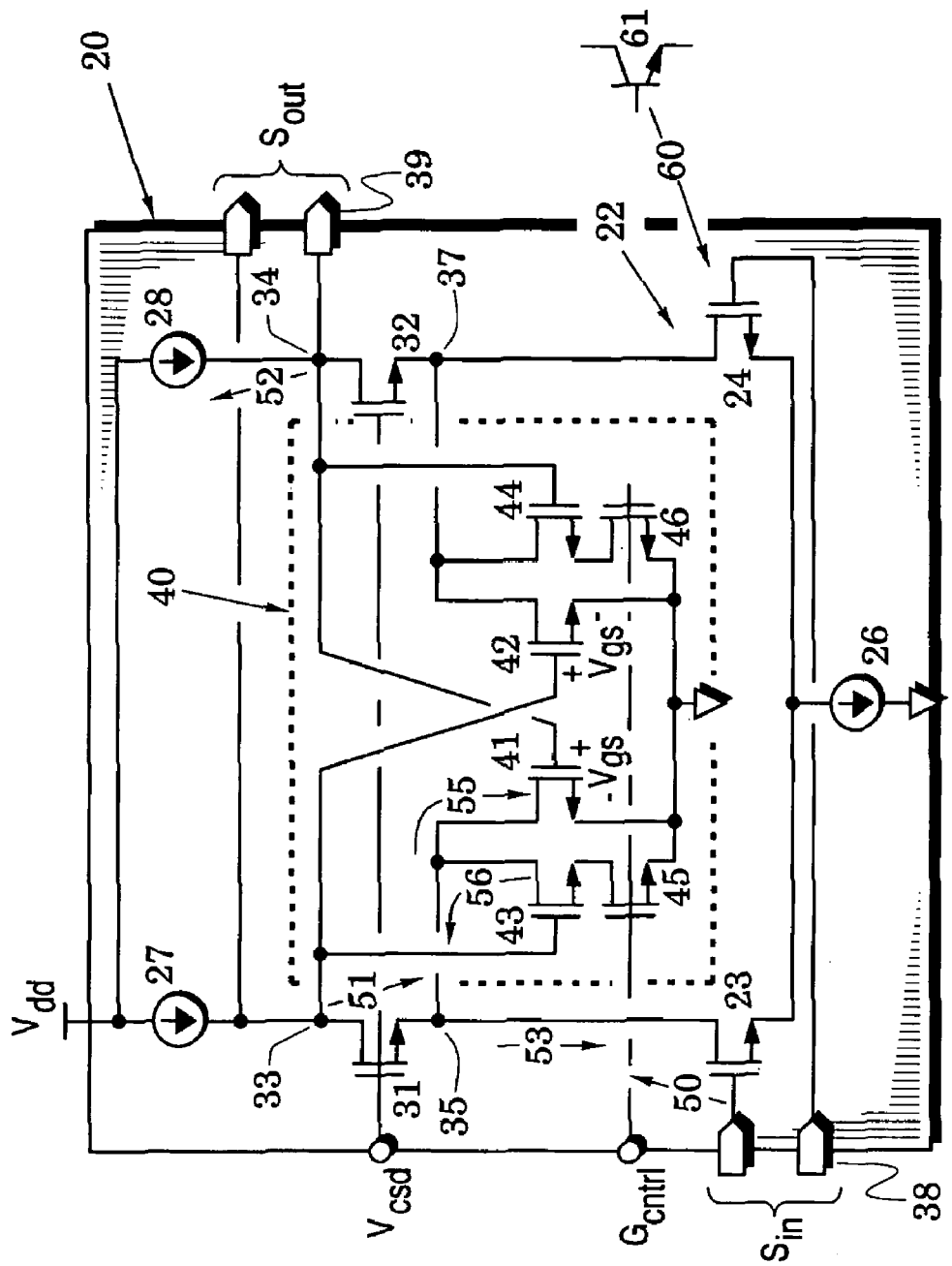
FIGS. 1 and 2 are schematics of amplifier embodiments of the present invention.

In particular, FIG. 1 illustrates an amplifier embodiment 20 which includes a differential pair 22 of first and second input transistors 23 and 24, a current source 26, first and second current sources 27 and 28, and first and second cascode transistors 31 and 32. The first and second cascode transistors 31 and 32 respectively have first and second upper current terminals 33 and 34 and first and second lower current terminals 35 and 37. They each also have a control terminal coupled to receive a cascode bias signal $V_{csd}$.

As shown in FIG. 1, the cascode transistors 31 and 32 are inserted so that the first and second upper current terminals 33 and 34 are respectively coupled to the first and second current sources 27 and 28 and the first and second lower current terminals 35 and 37 are respectively coupled to the first and second input transistors 23 and 24.

In addition, the first and second input transistors are coupled to differentially steer the current of the current source 26 through the cascode transistors in differential response to an input signal Sin that is received at an amplifier input port 38. Finally, the first and second upper current terminals 33 and 34 of the cascode transistors 31 and 32 are coupled to differentially provide an amplifier output signal $S_{out}$ at an amplifier output port 39 in response to the input signal $S_{in}$.

The amplifier 20 also has a controller 40 that enhances amplifier gain and effectively controls an amplifier common-mode output level. The controller includes first and second positive-feedback transistors 41 and 42 that are respectively coupled to the first and second lower current terminals 35 and 37. Preferably, the controller also includes first and second negative-feedback transistors 43 and 44 that are respectively coupled to the first and second lower current terminals 35 and 37 and further includes first and second control transistors 45 and 46 that are respectively coupled in series with the negative-feedback transistors 43 and 44.

In an important feature of the amplifier embodiment 20, the first and second positive-feedback transistors 41 and 42 respectively have first and second control terminals (gates) that are respectively coupled to the second and first upper current terminals 34 and 33 while the first and second negative-feedback transistors 43 and 44 respectively have first and second control terminals (gates) that are respectively coupled to the first and second upper current terminals 33 and 34. Thus, the control terminals of the positive-feedback transistors 41 and 42 are cross-coupled to receive the output signal $S_{out}$ whereas the control terminals of the negative-feedback transistors 43 and 44 are direct-coupled to receive the output signal $S_{out}$.

Before examining the operation of the amplifier 20, it is initially noted that the first and second current sources 27 and 28 and the first and second cascode transistors 31 and 32 substantially increase the impedance at the output port 39 so that currents steered through the first and second cascode transistors 31 and 32 generate an output signal having a significant signal swing and, accordingly, the amplifier realizes a substantial gain from input signal $S_{in}$ to output signal $S_{out}$.

Although the first and second current sources 27 and 28 provide a high output impedance to thereby enhance signal gain, they fail to define a well-controlled common-mode output level. In the absence of the controller 40, the common-mode level will move to a voltage level at which the dc current through each of the current sources 27 and 28 is one half of the tail current that the current source 26 provides to the differential pair 22. Because of parameter variations across a typical set of integrated-circuit amplifiers, this common-mode level will differ for each integrated circuit of the set.

The resulting common-mode levels may be such that the output signal swing is clipped at top or bottom. In addition, the resulting common-mode levels may degrade the output impedance of the cascode transistors 31 and 32 or the current sources 27 and 28. If these devices are realized with metal-oxide-semiconductor (MOS) transistors, for example, the resulting common-mode levels may be such that some of them no longer operate in their high-impedance saturation region but rather in their lower-impedance triode region.

Accordingly, the controller 40 is structured to accurately set and control the amplifier common-mode output level, enhance amplifier gain and maintain high amplifier output impedance. To examine operation of the controller 40, it is convenient to consider the left half of the amplifier 20 and to initially assume that the input signal $S_{in}$ causes the potential of the control terminal of the input transistor 23 to momentarily rise as indicated by the potential arrow 50.

In response, additional current is steered through the cascode transistor 31 and, accordingly, the potential of the first upper current terminal 33 will momentarily drop as indicated by the potential arrow 51. At the same time, the differential input signal will cause the control terminal of the input transistor 24 to drop so that less current is steered through the cascode transistor 32 and the potential of the second upper current terminal 34 will momentarily rise as indicated by the potential arrow 52.

The momentarily increased current that is steered through the first cascode transistor 31 is indicated by current arrow 53. This increased current flows away from the first lower current terminal 35. Meanwhile, the potential rise 52 at the second upper current terminal 34 is coupled to the control terminal of the first positive-feedback transistor 41 so that it also pulls a momentarily increased current 55 from the first lower current terminal 35. The increased current 55 substitutes for at least a portion of the current 53 and the latter current thus substantially decreases. Simultaneously, a similar current substitution takes place at the second lower current terminal 37 so that there is a reduction of the currents supplied by the differential pair 22 to the first and second lower current terminals 35 and 37.

This current substitution is, however, modified by the negative-feedback transistors 43 and 44. Directing attention to the first negative-feedback transistor 43, it is apparent that it provides a current 56 in response to the potential at the first upper current terminal 33. The current 56 subtracts from the current 55 and the current difference ΔI between these two currents can be chosen to adjust the magnitude of the current 53 to any selected level. A similar process of current modification occurs with respect to the second negative-feedback transistor 44 so that a combination of the positive-feedback transistors 41 and 42 and the negative-feedback transistors 43 and 44 effects a controlled reduction of the currents supplied by the differential pair 22 to the first and second lower current terminals 35 and 37.

This controlled adjustment of the current 53 (and a similar current through the second input transistor 24) is preferably obtained with a gain control signal $G_{cntrl}$ that is applied to control terminals of the first and second control transistors 45 and 46. Because the negative-feedback transistors are arranged in cascode with the control transistors, the latter are biased in their triode regions and the gain control signal's magnitude can thus be selected to vary their impedances to thereby obtain a desired level of the current 56 and of a similar current through the second negative-feedback transistor 44. Essentially, the first and second control transistors 45 and 46 degenerate the transconductances of the first and second negative-feedback transistors 43 and 44 and these transconductances are thus controlled by the gain control signal $G_{cntrl}$.

If the amplifier 20 is embedded, for example, in a feedback loop, the feedback reduces the input signal $S_{in}$ because the voltage at the amplifier input port 38 approaches a virtual ground as the currents of the differential pair 22 are reduced in response to the gain control signal $G_{cntrl}$. The voltage transfer function of the amplifier 20 is given by $g_m Z_o$ wherein $g_m$ is transconductance of the input transistors 23 and 24 and $Z_o$ is the output impedance at the amplifier output port 39. The reduction of the input voltage substantially increases the amplifier gain and since transistor transconductance $g_m$ has not changed, the effect is that the amplifier's output impedance $Z_o$ substantially increases.

Thus, amplifier gain and output impedance have been substantially enhanced by the positive-feedback transistors. The control provided by the negative-feedback transistors 43 and 44 facilitates the realization of any of various predetermined amplifier gains and output impedances. In other amplifier embodiments, additional control can be provided with appropriate sizing of the transistors (e.g., adjusting the size of the positive-feedback transistors 41 and 42 relative to that of the input transistors 23 and 24).

In addition to enhancing amplifier gain and output impedance, the controller 40 simultaneously controls the amplifier's common-mode output level. This is apparent because the source of the positive-feedback transistor 41 is coupled to circuit ground while its gate is coupled to one side of the output port 39. Accordingly, the common-mode signal level at that side is set to the gate-to-source voltage $V_{gs}$ of the positive-feedback transistor 41. In a similar manner, the common-mode signal level at the other side of the output port 39 is set to the $V_{gs}$ of the positive-feedback transistor 42.

Although the amplifier 20 of FIG. 1 is formed with metal-oxide-semiconductor transistors, other amplifier embodiments may be realized with different transistor types or combination of types. For example, bipolar junction transistors may be substituted for some or all of the metal-oxide-semiconductor transistors as exemplified by the substitution arrow 60 which substitutes bipolar junction transistor 61 for the metal-oxide-semiconductor transistor 22.

Figure 2:
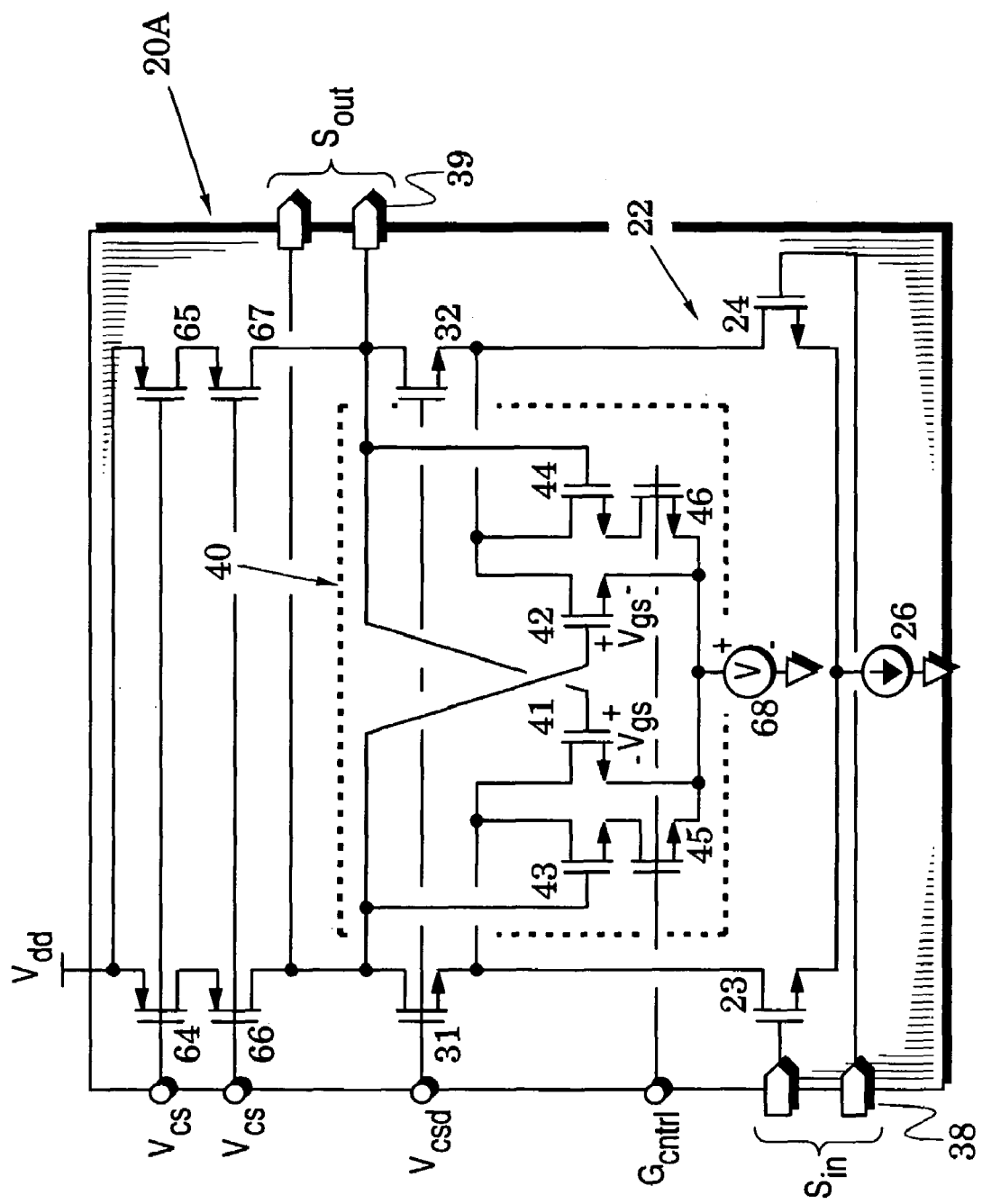

FIG. 2 illustrates an amplifier embodiment 20A which includes elements of FIG. 1 with like elements indicated by like reference numbers. In the embodiment 20A, the current sources 27 and 28 of FIG. 1 are realized with current-source transistors 64 and 65 that receive a current source bias $V_{cs}$. To further increase the output impedance of these current sources, current-source transistors 66 and 67 are inserted to respectively be in a cascode arrangement with transistors 64 and 65.

In addition, a voltage source 68 is inserted between the controller 40 and circuit ground. In the amplifier embodiment 20 of FIG. 1, the common-mode level of output signals $S_{out}$ at the output port 39 was controlled to be the gate-to-source voltage $V_{gs}$ of the positive-feedback transistors 41 and 42. In the amplifier embodiment 20A, the common-mode level can be varied or offset by varying the voltage V that is supplied by the voltage source 68.

It was mentioned above that control of the current 56 (of FIG. 1) is obtained with a gain control signal $G_{cntrl}$ that biases the control transistor 45 in its triode region and that the gain control signal's magnitude can be selected to vary the control transistor's impedance to thereby obtain a desired level of the current 56.

FIG. 3A repeats a portion 70 of the amplifier 20 of FIG. 1 (with like elements indicated by like reference numbers) and replaces the control transistor 45 with a set of control transistors 45A, 45B and 45C that are arranged in parallel. A group of switches 71 are arranged to each couple the control terminal of a respective one of the control transistors to selected ones of control potentials $V_{cntrl}$ (e.g., $V_{dd}$). The switches can be placed in selected states by a digital gain control signal $G_{cntrl}$. The control transistors 45A, 45B and 45C can be configured (e.g., with different gate widths) so that they present different impedances (e.g., a binary relationship of impedances) in response to one of the potentials (e.g., $V_{dd}$). The control signal $G_{cntrl}$ can thereby command the set of control transistors so that the controller (40 in FIG. 1) exhibits amplifier control in a predetermined manner (e.g., a binary manner). With appropriate sizing of the control transistors, different types (e.g., digital and analog) of amplifier control can be realized.

FIG. 3B repeats a portion 72 of the amplifier 20 of FIG. 1 (with like elements indicated by like reference numbers) and inserts third and fourth control transistors 75 and 76 respectively between the first and second positive-feedback transistors 41 and 42 and ground. The control signal $G_{cntrl}$ is now a differential control signal with control terminals of the first and second control transistors 45 and 46 responding to one side of the control signal and control terminals of the third and fourth control transistors 75 and 76 responding to the other side. The portion 72 thus enables the controller (20 in FIG. 1) to exhibit differential gain control.

The amplifier embodiments of FIGS. 1–3B can be used as portions of various operational amplifiers. For example, FIG. 4 illustrates an operational amplifier 80 which positions a differential pair 82 of transistors 83 and 84 between the amplifier 20A of FIG. 2 and source followers 86 and 87.

The differential pair 82 thus forms a second differential amplifier stage between the source followers and a differential input amplifier stage formed by the amplifier 20A. For illustrative clarity, the controller 40 of FIG. 2 is shown as a single block and the voltage source 68 is removed. The current source 26 has been realized as a pair of current sources 26A and 26B and the input port 38 has been retained but the output port 39 has been removed.

The differential pair 82 is coupled between current-source load transistors 90 and 91 and a current source 92 which supplies a tail current. The differential pair 82 further enhances the differential gain that is initiated by the amplifier 20A. The source followers 86 and 87 are to current sources 96 and 97 and are inserted to drive loads at an output port 98.

Figure 4:
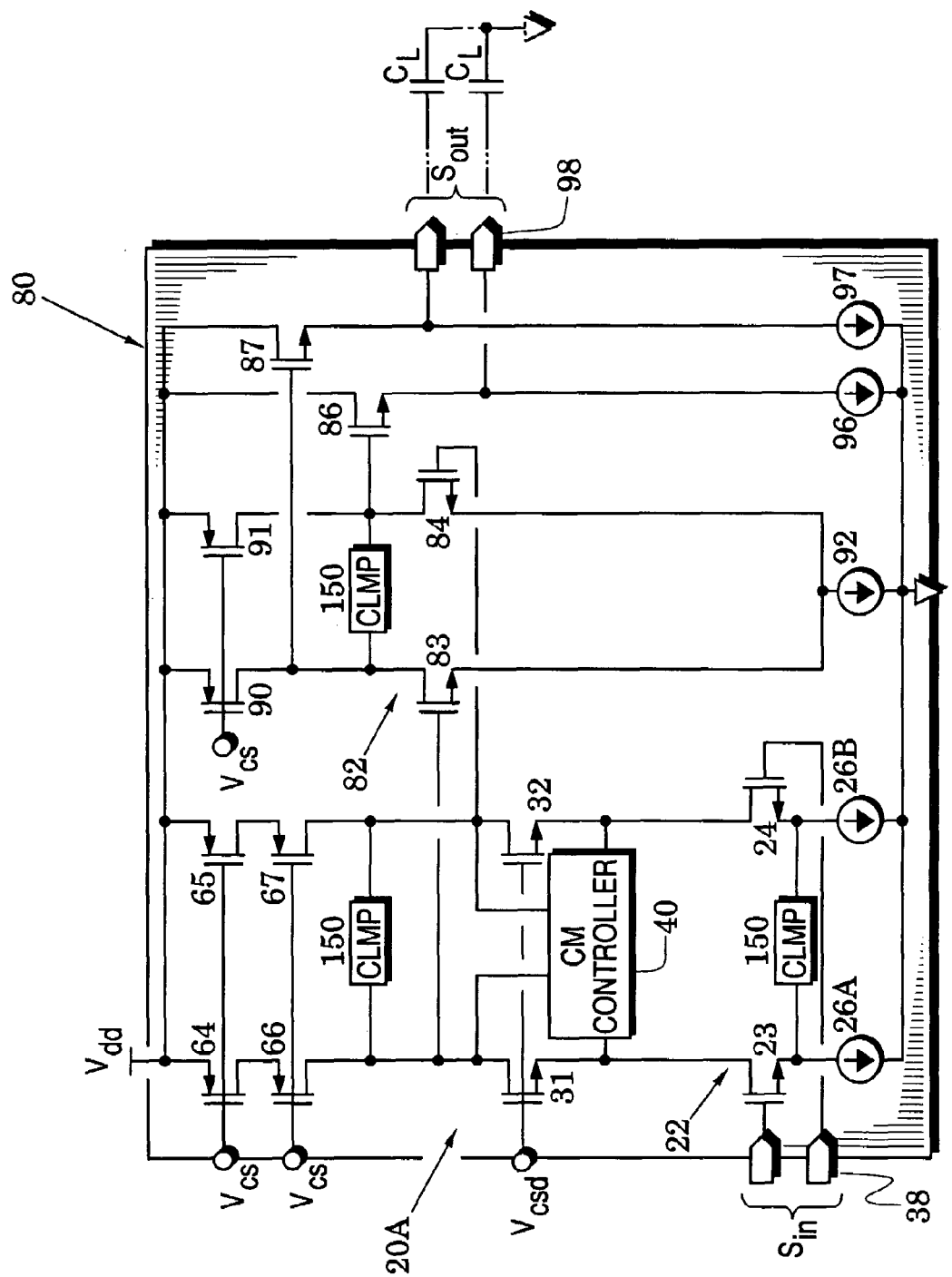
FIG. 4 is a schematic of an operational amplifier embodiment which includes the amplifier of FIG. 2.
Figure 5:
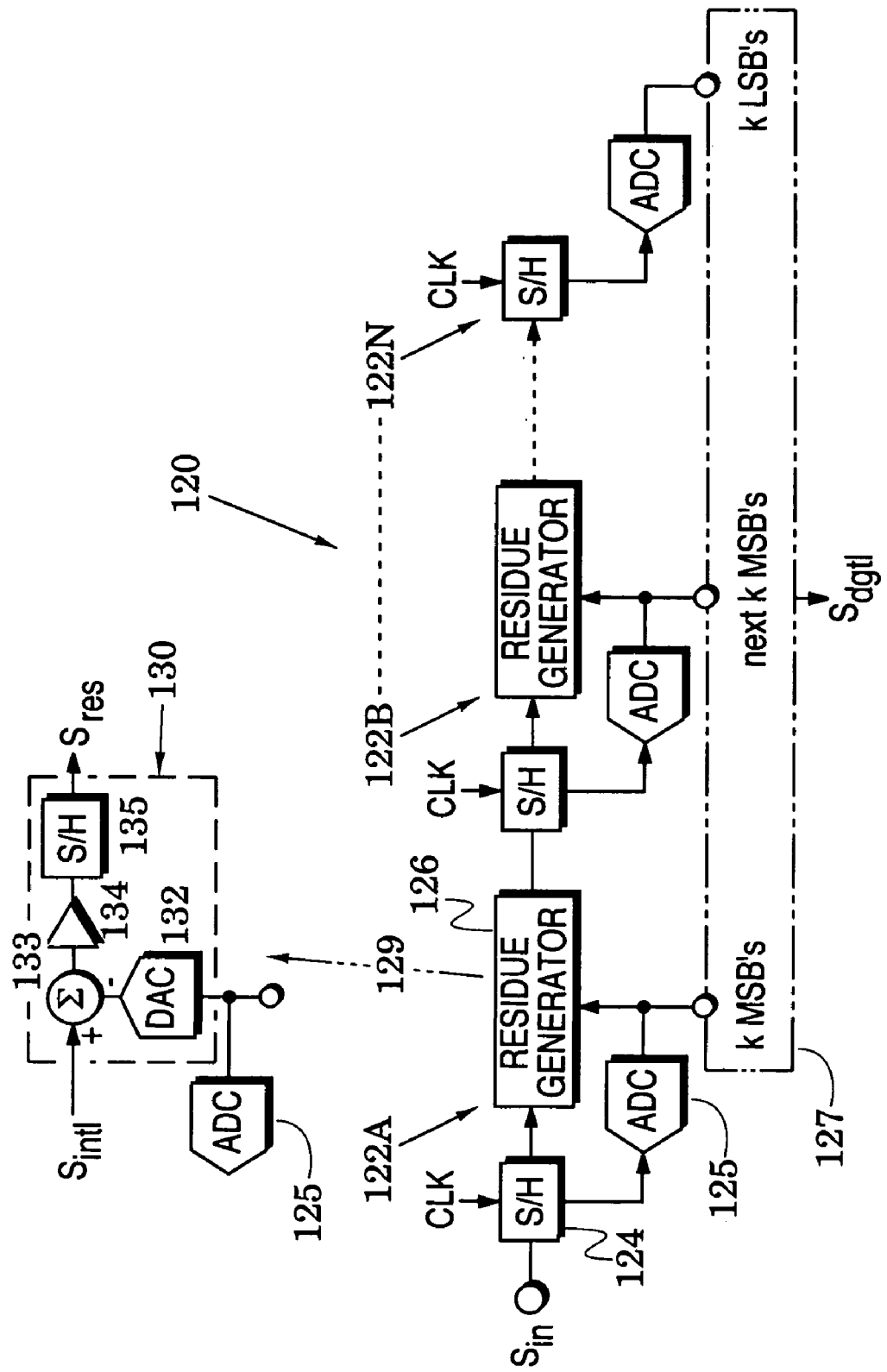
FIG. 5 is a block diagram of an analog-to-digital converter embodiment which includes the operational amplifier of FIG. 3.

Although the amplifier embodiment 80 of FIG. 4 can be used in a variety of amplifier applications, it is especially suited for driving capacitive loads such as the loads CL shown at the output port 98. Accordingly, it can be effectively used in multiplying digital-to-analog converters (MDACs) of a pipelined analog-to-digital converter system such as the converter system 120 of FIG. 5.

This system comprises a plurality of converter stages 122A, 122B, ... 122N that are serially connected to thereby convert an analog input signal $S_{in}$ to a corresponding digital output signal $S_{dgtl}$. Each converter stage generates a sample of a respective portion of the analog signal, provides at least one corresponding digital bit, and passes to a subsequent stage a residue signal that represents the difference between that sample and an analog signal that corresponds to the provided digital bit which was an estimate of the sample.

As shown in FIG. 5, a typical converter stage 122A includes a sampler 124 (designated S/H for sample and hold), an ADC 125 and a residue generator 126. In operation of the converter stage 122A, the sampler 124 provides initial samples of an analog input signal at the rate of a clock (CLK). The ADC 125 converts each initial sample to k of the most significant bits (MSB's) for this initial sample. The residue generator 146 converts the k MSB's to an analog estimate (estimate of the analog sample) and subtracts this analog estimate from the initial sample to form a residue signal that can be passed to a subsequent converter stage for derivation of further MSB's that apply to the initial sample.

To enhance conversion accuracy, the residue signal is preferably "gained up" in the residue generator so that the analog window presented to the subsequent converter stage is substantially that of the preceding converter stage. Because the final converter stage 122N provides the final least significant bits (LSB's) of the initial sample, it does not require the residue generator of preceding stages. The converter stages are generally designed to provide digital redundancy and an error corrector 127 is typically provided to use this redundancy as it processes the bits of each converter stage into the final digital output signal $S_{dgtl}$ that corresponds to the initial analog sample.

Example arrow 129 illustrates the functional portions of an exemplary residue generator 130 that is generally referred to as a multiplying digital-to-analog converter. The residue generator 130 includes a DAC 132, a summer 133, an amplifier 134 and another sampler 135. The DAC 132 converts the digital estimate of the ADC 125 to form a corresponding analog estimate. This estimate is subtracted from the initial sample $S_{intl}$ in the summer 133 to find a difference and this difference is amplified in the amplifier 134 to provide the residue signal $S_{res}$. The sampler 135 holds this residue for processing by the succeeding converter stage. The gain of the amplifier is selected so that the amplitude range of samples presented to the succeeding converter stage approximates the range processed by the present converter stage.

Partly because they lend themselves to integrated circuit fabrication techniques, switched-capacitor realizations of MDAC's have been found particularly useful. FIGS. 6A and 6B illustrate an exemplary switched-capacitor MDAC 140 that is formed with a differential amplifier 142, a set of capacitors $C_1$ and $C_2$, and a set of switches (for illustrative clarity, the switches are not shown).

FIG. 6A illustrates a first operational mode in which capacitors $C_2$ are coupled between differential inputs and differential outputs of the amplifier 142 while capacitors $C_1$ are switched to receive charges (as indicated by charge-reception currents 143) from the differential outputs of an MDAC 140' in a preceding converter stage. The amplifier 142 is preferably structured (e.g., with internal clamps) to remove all charges from the capacitors $C_2$ during this first operational mode. An MDAC 140" of a succeeding converter stage is shown in a configuration similar to that of the MDAC 140'.

FIG. 6B illustrates a second operational mode in which capacitors $C_2$ remain coupled between differential inputs and differential outputs of the amplifier 140 while the capacitors $C_1$ are switched to the amplifier's differential inputs. The associated ADC (125 in FIG. 5) converts the residue signal of the preceding converter stage to its corresponding digital bits and provides an indicator D that is indicative of those bits. A reference signal $DV_{ref}$ is then coupled to the other ends of the capacitors $C_1$ wherein the reference $V_{ref}$ generally represents one half of the full-scale range of the associated ADC.

As indicated by charge-transfer currents 144 in FIG. 6B, the reference signal $DV_{ref}$ causes the charges in the capacitors $C_1$ to be transferred into the capacitors $C_2$ to thereby generate the residue signal $S_{res}$. In other switched-capacitor embodiments, the capacitors $C_2$ are also switched to receive charge-reception currents 143 from the MDAC 140' in the first operational mode of FIG. 6A. In the second operational mode, they are then switched to the positions shown in FIG. 6B. The capacitors $C_1$ and $C_2$ are appropriately sized depending upon the specific switched-capacitor structure that is employed.

The conversion fidelity of the converter system (120 in FIG. 5) is a function of the accuracy of the charge transfer that occurs in the first and second operational modes of FIGS. 6A and 6B between the capacitors $C_1$ and $C_2$. The accuracy of this transfer substantially depends on the gain of the differential amplifier 142. The greater this gain, the smaller the voltage error across the amplifier's differential input so that it appears to be a virtual ground. Accordingly, error in the residue signal $S_{res}$ is substantially reduced once the charge transfer is completed. The amplifier structures of FIGS. 1–4 provide these desired amplifier parameters.

In one application of amplifier embodiments of the invention, effective values of the gain control signal $G_{cntrl}$ (in FIGS. 1–3B) can be established during calibration modes of the converter system 120 of FIG. 5. In another application, the amplifier embodiments can be embedded in a servo loop that continuously adjusts the gain control signal.

It was noted above that the amplifier 142 of FIGS. 6A and 6B is preferably structured to remove all charges from the capacitors $C_2$ during the MDAC's first operational mode. FIG. 2 indicates that internal clamps 150 (indicated as CLMP) for this purpose may be coupled across outputs of the differential pairs 22 and 82 and across the current sources 26A and 26B.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. An amplifier, comprising:
   first and second current sources;
   a differential pair of first and second input transistors;
   first and second cascode transistors respectively having first and second upper current terminals respectively coupled to said first and second current sources and respectively having first and second lower current terminals respectively coupled to said first and second input transistors; and
   first and second positive-feedback transistors respectively coupled to said first and second lower current terminals and respectively having first and second control terminals respectively coupled to said second and first upper current terminals.

2. The amplifier of claim 1, further including first and second negative-feedback transistors respectively coupled to said first and second lower current terminals and respectively having first and second control terminals respectively coupled to said first and second upper current terminals.

3. The amplifier of claim 2, further including first and second control transistors respectively coupled in series with said first and second negative-feedback transistors and having control terminals for receiving a gain control signal.

4. The amplifier of claim 3, further including third and fourth control transistors respectively coupled in series with said first and second positive-feedback transistors and having control terminals for receiving a second gain control signal.

5. The amplifier of claim 2, further including:
   first and second sets of control transistors respectively coupled in series with said first and second negative-feedback transistors;
   and
   switches that are each coupled to a control terminal of a respective one of said control transistors to apply selected potentials in response to a gain control signal.

6. The amplifier of claim 3, wherein said input, cascode and positive-feedback transistors are metal-oxide-semiconductor transistors.

7. The amplifier of claim 1, further including a voltage source inserted in series with said positive-feedback transistors to thereby offset an amplifier common-mode level.

8. The amplifier of claim 1, wherein said first and second current sources each comprise cascoded transistors.

9. An amplifier, comprising:
   first and second current sources;
   an input differential pair of first and second input transistors;
   first and second cascode transistors respectively having first and second upper current terminals respectively coupled to said first and second current sources and respectively having first and second lower current terminals respectively coupled to said first and second input transistors;
   first and second positive-feedback transistors respectively coupled to said first and second lower current terminals and respectively having first and second control terminals respectively coupled to said second and first upper current terminals;
   first and second source followers; and
   an output differential pair of first and second output transistors coupled between said first differential pair and said source followers.

10. The amplifier of claim 9, further including:
    first and second negative-feedback transistors respectively coupled to said first and second lower current terminals and respectively having first and second control terminals respectively coupled to said first and second upper current terminals; and
    first and second control transistors respectively coupled in series with said first and second negative-feedback transistors and having control terminals for receiving a gain control signal.

11. The amplifier of claim 10, further including third and fourth control transistors respectively coupled in series with said first and second positive-feedback transistors and having control terminals for receiving a second gain control signal.

12. The amplifier of claim 9, further including:
    first and second negative-feedback transistors respectively coupled to said first and second lower current terminals and respectively having first and second control terminals respectively coupled to said first and second upper current terminals;
    first and second sets of control transistors respectively coupled in series with said first and second negative-feedback transistors;
    and switches that are each coupled to a control terminal of a respective one of said control transistors to apply selected potentials in response to a gain control signal.

13. The amplifier of claim 9, wherein said input, cascode and positive-feedback transistors are metal-oxide-semiconductor transistors.

14. The amplifier of claim 9, further including a voltage source inserted in series with said positive-feedback transistors to thereby offset an amplifier common-mode level.

15. The amplifier of claim 9, further including a voltage source inserted in series with said positive-feedback transistors to thereby offset an amplifier common-mode level.

16. The amplifier of claim 9, wherein said first and second current sources each comprise cascoded transistors.

17. A signal converter system, comprising:
   a plurality of converter stages serially connected to thereby convert an analog input signal to a corresponding digital output signal wherein at least one of said stages includes:
   an analog-to-digital converter that converts a respective portion of said input signal to at least one corresponding digital bit of said output signal;
   a digital-to-analog converter that provides reference signals in response to said corresponding digital bit;
   a differential amplifier; and
   a set of capacitors switched to a preceding one of said stages in a first converter operational mode and switched between said amplifier and said reference signals to provide a residue signal to a succeeding one of said stages in a second converter operational mode;
   wherein said amplifier has an input stage that includes:

a) first and second current sources;
   b) a differential pair of first and second input transistors;
   c) first and second cascode transistors respectively having first and second upper current terminals respectively coupled to said first and second current sources and respectively having first and second lower current terminals respectively coupled to said first and second input transistors; and
   d) first and second positive-feedback transistors respectively coupled to said first and second lower current terminals and respectively having first and second control terminals respectively coupled to said second and first upper current terminals.

18. The system of claim 17, further including first and second negative-feedback transistors respectively coupled to said first and second lower current terminals and respectively having first and second control terminals respectively coupled to said first and second upper current terminals.

19. The system of claim 17, further including first and second control transistors respectively coupled in series with said first and second negative-feedback transistors and having control terminals for receiving a gain control signal.

20. The system of claim 17, further including:
   first and second source followers; and
   an output stage comprising a differential pair of first and second output transistors coupled between said first differential pair and said source followers.

* * * * *